United States Patent [19]
Iino et al.

[11] Patent Number: 5,089,777
[45] Date of Patent: Feb. 18, 1992

[54] MAGNETIC RESONANCE IMAGING APPARATUS

[75] Inventors: Mitsutoshi Iino; Shirou Nakato; Seiichi Shinkai; Hideki Shimojima, all of Hino; Hiromi Kawaguchi, Kawasaki, all of Japan

[73] Assignees: Fuji Electric Co., Ltd., Kanagawa; FUJIFACOM Corporation, Tokyo, both of Japan

[21] Appl. No.: 533,593

[22] Filed: Jun. 5, 1990

[30] Foreign Application Priority Data

Jun. 9, 1989 [JP] Japan .................................. 1-145075

[51] Int. Cl.⁵ .......................................... G01R 33/20
[52] U.S. Cl. .................................................. 324/309
[58] Field of Search ...................... 324/307, 309, 312; 128/653 A

[56] References Cited

U.S. PATENT DOCUMENTS 4,789,833 12/1988 Nishimura ............................ 324/309
4,812,762 3/1989 Den Boef ............................. 324/309
4,868,502 9/1989 Hanakawa et al. .................. 324/309
4,908,578 3/1990 Van Liere ............................ 324/307

Primary Examiner—Michael J. Tokar
Attorney, Agent, or Firm—Spencer & Frank

[57] ABSTRACT

When a two-dimensional Fourier transform is used, a magnetic resonance imaging apparatus has a first arithmetic unit for executing the Fourier transform in a first dimension in the repetition time interval immediately after each data acquisition or in parallel with the data acquisition, and a second arithmetic unit for executing the Fourier transform in a second dimension after all the data has been acquired. When a three-dimensional Fourier transform is used, the apparatus has a first arithmetic unit for executing the Fourier transform in a first dimension in the time interval immediately after each data acquisition or in parallel with the data acquisition, a second arithmetic unit for executing the Fourier transform in a second dimension immediately after the data acquisition of one matrix in the phase encoding direction, and a third arithmetic unit for executing the Fourier transform in a third dimension after all the data are acquired.

4 Claims, 6 Drawing Sheets

MAGNETIC RESONANCE IMAGING APPARATUS

BACKGROUND OF THE INVENTION

1. Field of the Invention

The present invention relates to a magnetic resonance imaging apparatus using a two- or three-dimensional Fourier transform.

2. Description of the Prior Art

When an atomic nucleus (a hydrogen atom or the like) is subjected to a uniform magnetic field, the spin of the nucleus shows precession in the magnetostatic field. If radio-frequency pulses (RF pulses) having the same frequency as that of the precession are applied to a subject in this state, magnetic resonance phenomenon occurs. The magnetic resonance imaging apparatus utilizes this phenomenon to acquire the images of cross-sections or the like of a subject. If a gradient magnetic field whose intensity varies along the specified direction is superimposed on the above mentioned magnetostatic field, each atom in a subject resonates or relaxes at different frequencies according to the intensity of the magnetic field. The frequency analysis of the signals thus acquired is performed to obtain the required images by using a Fourier transform.

The following examples are known techniques about the above-mentioned Fourier transform method.

(1) Fourier Transform Zeugmatography (original method)

A. Kumar, I. Welti, and R. R. Ernst: "NMR Fourier Zeugmatography" J. Magn, Reson, 18, p. 69 (1975).

(2) Spin Warp Method

W. A. Edelstein, J. M. S. Hutchison, G. Johnson, and T. W. Redpath: "NMR Imaging and Applications to Human Whole-Body Imaging" Phys. Med. Biol. 25, p. 751 (1980).

This method uses a field echo method to generate an echo, but this method is a mathematical equivalent of the method (1).

(3) Improved Spin Warp Method (an example thereof is shown in FIG. 5)

This method uses 180° RF pulses to generate an echo, but the other principles are identical to the methods (1) and (2).

FIG. 1 is a block diagram showing a conventional magnetic resonance imaging apparatus.

A subject 1 is placed in a magnetosatic field coil 2 which generates a uniform magnetostatic field. A computer system 11 comprises a pulse sequencer 13, a CPU 14, a hard disk 15, a console 16, a digital input interface 17, an array processor 18, etc. These devices are combined with one another by a system bus 12.

When an imaging command is fed to the system from the console 16, the CPU 14 starts the pulse sequencer 13. The pulse sequencer 13 controls gradient magnetic field power sources Gx 5, Gy 6, and Gz 7, and an RF transmitting system 8. A gradient magnetic field coil 3 and an RF coil 4 generate a prescribed gradient magnetic field and a radio-frequency magnetic field, respectively. Thus, NMR (nuclear magnetic resonance) signals are generated from the subject 1. These NMR signals are received by the RF coil 4, are detected and amplified by an RF receiving system 9, and are converted into digital signals by an A/D converter 10. The digital signals are read into the computer system 11 through the digital input interface 17. The read data (raw data) are temporarily accumulated in the hard disk 15. When all the data have been acquired, these data are sent to the array processor 18, where an image reconstruction operation is performed. The operation result is displayed on the console 16 as an image.

FIG. 2 shows a typical example of pulse sequences used by the two-dimensional Fourier transform method.

A pulse sequence (a) is that of an RF magnetic field, and pulse sequences (b), (c) and (d) are those of the outputs of the gradient magnetic field Gz, Gx, and Gy, respectively. The reference numeral 201 designates 90° RF pulses, 202 denotes a gradient magnetic field for selecting a slice, 203 designates a gradient magnetic field for frequency encoding, and 204 denotes a gradient magnetic field for phase encoding. To acquire an image of an L×M matrix, NMR signal 205 is sampled at L sampling points by the A/D converter 10 (see reference numeral 206). Pulse sequences (e) and (f) in FIG. 2 show NMR signals, and the operation of the A/D converter 10, respectively. This combination of sequences 201 to 206 is repeated a total of M times at the repeated intervals of $T_R$, with varying phase encoding as indicated by the reference numeral 204. Finally, two-dimensional image data are acquired by conducting an image reconstruction operation including a two-dimensional Fourier transform to the L×M point data thus obtained.

FIG. 3 shows common pulse sequences in a three-dimensional Fourier transform method.

As in FIG. 2, a pulse sequence (a) in FIG. 3 shows that of an RF magnetic field. Pulse sequences (b), (c), and (d) in FIG. 3 show the outputs of the gradient magnetic fields Gz, Gx, and Gy, respectively. Pulse sequences (e) and (f) in FIG. 3 show NMR signal and the operation of the A/D converter 10, respectively. A reference numeral 302 designates a gradient magnetic field for frequency encoding, and reference numerals 303 and 304 denote gradient magnetic fields along the X and Y axis for phase encoding. To acquire an image associated with an L×M×N matrix, the NMR signal 305 is sampled at L sampling points by the A/D converter 10 as indicated by reference numeral 306. Then, this combination of sequences 301 to 306 is repeated a total of M times at the repeating interval of time $T_R$ with varying phase encoding in the direction of the Y axis as indicated by the reference numeral 304. This M time repetition is repeated a total of N times with varying phase encoding in the direction of the Z axis as shown by the reference numeral 302. By achieving image reconstruction operation including three-dimensional Fourier transform to the L×M×N sampling points thus obtained, three-dimensional image data can be acquired.

The magnetic resonance imaging apparatus described above carries out the image data reconstruction operation after all the data about the subject has been collected. This poses a problem that too much time is taken to generate an image: the total time required for testing a subject is the sum of the data acquisition time and the image reconstruction time, which is very time-consuming.

SUMMARY OF THE INVENTION

It is therefore an object of the present invention to provide a magnetic resonance imaging apparatus that can reduce the time required to reconstruct an image, particularly, the time required to execute the Fourier transform.

To accomplish this object, the present invention provides a magnetic resonance imaging apparatus which, in the case where two-dimensional Fourier transform is used, has a first computing means for executing the Fourier transform in a first dimension in the time interval immediately after each data acquisition, or in parallel with the data acquisition, and has a second computing means for executing the Fourier transform in a second dimension after all the data has been acquired. The first and second computing means can be integrated into one unit.

When three-dimensional Fourier transform is used, the apparatus is provided with a first computing means for executing the Fourier transform in a first dimension in the time interval immediately after each data acquisition, or in parallel with the data acquisition, a second computing means for executing the Fourier transform in a second dimension immediately after the data acquisition for one matrix in the phase encoding direction, and a third computing means for executing the Fourier transform in a third dimension after all the data are acquired.

Thus, the reduction of time required for image reconstruction operation, especially for a Fourier transform in the image reconstruction operation is achieved.

This will be explained more specifically.

To obtain an image of an $L \times M$ matrix (L points in the direction of Gx, and M points in the direction of Gy) by using pulse sequences in FIG. 2, two-dimensional inverse discrete Fourier transform (2D-IDFT) expressed by the following equation is performed during the image reconstruction.

$$G(x,y) = \frac{1}{LM} \sum_{l=0}^{L-1} \sum_{m=0}^{M-1} g(l,m) W_1^{-lx} W_2^{-my} \qquad (1)$$

where x: the coordinates of the image to be reconstructed in the direction of Gx axis (x=0, 1, ..., L−1), y: the coordinates of the image to be reconstructed in the direction of Gy axis (y=0, 1, ..., M−1), l: sampling points in the direction of Gx axis (l=0, 1, ..., L−1), m: sampling points in the direction of Gy axis (m=0, 1, ..., M−1), $W_1$: phase rotation factor ($W_1 = e^{-j2\pi/L}$), $W_2$: phase rotation factor ($W_2 = e^{-j2\pi/M}$), G(x,y): values of pixels at points (x,y) (image data), g(l,m): sampling data of the l-th point of the m-th sampling, j: $\sqrt{-1}$ The above equation (1) can be resolved to the following two one-dimensional inverse discrete Fourier transforms:

$$g'(x,m) = \frac{1}{L} \sum_{l=0}^{L-1} g(l,m) W_1^{-lx} \qquad (2)$$

$$G(x,y) = \frac{1}{M} \sum_{m=0}^{M-1} g'(x,m) W_2^{-my} \qquad (3)$$

where g' (x,m): one dimensional inverse discrete Fourier transform for the m-th sampling data series g (l,m)|l=0, 1, ..., L−1.

The A/D converter 10 performs L point data sampling by M times in this case. Accordingly, each time an L point data sampling is completed, the calculation of equation (2) can be performed. All calculations of equation (3) have to be done after the acquisition of all data.

Next, use of the three-dimensional Fourier transform is explained. To obtain an image of an $L \times M \times N$ matrix (L points in the direction of Gx axis, M points in the direction of Gy axis, and N points in the direction of Gz axis) by the pulse sequences shown in FIG. 3, the three-dimensional inverse discrete Fourier transform (3D-IDFT) expressed by the following equation (4) is performed.

$$G(x,y,z) = \frac{1}{LMN} \sum_{l=0}^{L-1} \sum_{m=0}^{M-1} \sum_{n=0}^{N-1} g(l,m,n) W_1^{-lx} W_2^{-my} W_3^{-nz} \qquad (4)$$

where

Z: the coordinates of the image to be reconstructed in the direction of Gz axis (Z=0, 1, ..., N−1), n: the sampling points in the direction of Gz axis (n=0, 1, ..., N−1), $W_3$: phase rotation factor ($W_3 = e^{-j2\pi/N}$)

G(x,y,z): values of pixels at points (x,y,z) (image data), g(l,m,n): the l-th sampling data of the n-th phase encoding of Gz and m-th phase encoding of Gx.

The notations other than above are the same as in equation (1). Then, equation (4) can be resolved into the following three one-dimensional inverse discrete Fourier transform:

$$g'(x,m,n) = \frac{1}{L} \sum_{l=0}^{L-1} g(l,m,n) W_1^{-lx} \qquad (5)$$

$$g''(x,y,n) = \frac{1}{M} \sum_{m=0}^{M-1} g'(x,m,n) W_2^{-my} \qquad (6)$$

$$G(x,y,z) = \frac{1}{N} \sum_{n=0}^{N-1} g''(x,y,n) W_3^{-nz} \qquad (7)$$

where g' (x,m,n): one-dimensional inverse discrete Fourier transform of sampling data series g(l,m,n)|l=0, 1, ..., L−1; the g(l,m,n) being the sampling data series of n-th phase encoding of Gz, and m-th phase encoding of Gy.

g'' (x,y,n): one-dimensional inverse discrete Fourier transform of g' (x,m,n)|m=0, 1, ..., M−1; the g' (x,m,n) being the set at point x of n-th Gz phase encoding.

In this case, the data acquisition is performed by repeating the L point sampling M times while varying the intensity of the phase encoding gradient magnetic field Gz, as shown in FIG. 3. Further, this is repeated N times varying the intensity of the phase encoding gradient magnetic field Gz. Therefore, the calculation of equation (5) can be initiated immediately after the first L point data sampling, and the calculation of equation (6) can be initiated immediately after the L×M point data acquisition at the same phase encoding gradient magnetic field of Gz. On the other hand, the calculation of equation (7) can only be initiated after all the data are collected.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Figure 4:
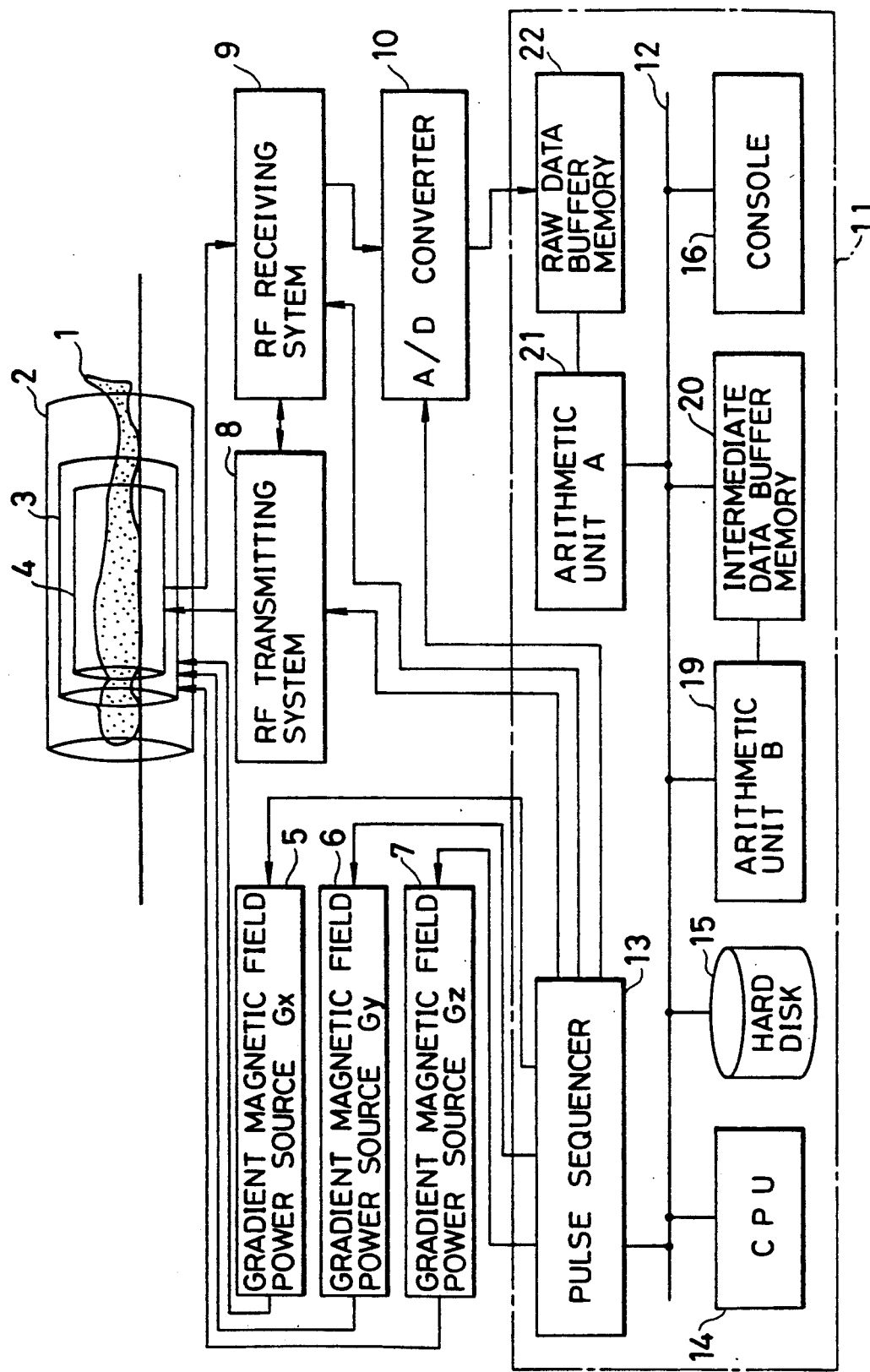
FIG. 4 is a block diagram showing an arrangement of a magnetic resonance imaging apparatus of an embodiment of the present invention.

An embodiment of the present invention is shown in FIG. 4. In FIG. 4, reference numerals 1-16 designate like parts shown in FIG. 1, and so the explanation thereof is omitted. Reference numeral 22 designates a buffer memory for storing raw data, 21 denotes a first arithmetic unit A, 19 designates a second arithmetic unit B, and 20 denotes an intermediate data buffer memory.

The operation of this embodiment will now be explained.

Figure 1:
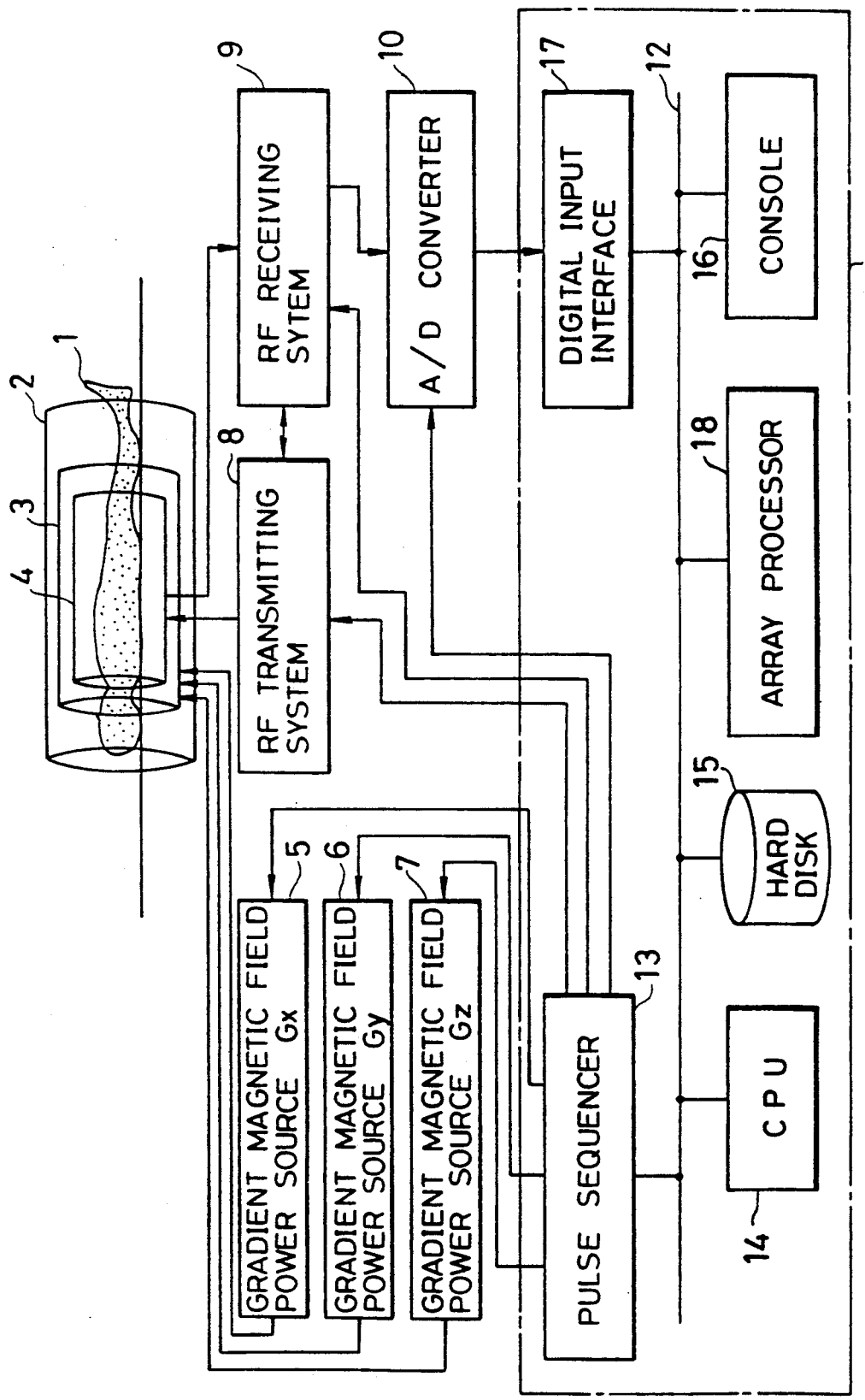
FIG. 1 is a block diagram showing an example of a conventional magnetic resonance imaging apparatus.
Figure 2:
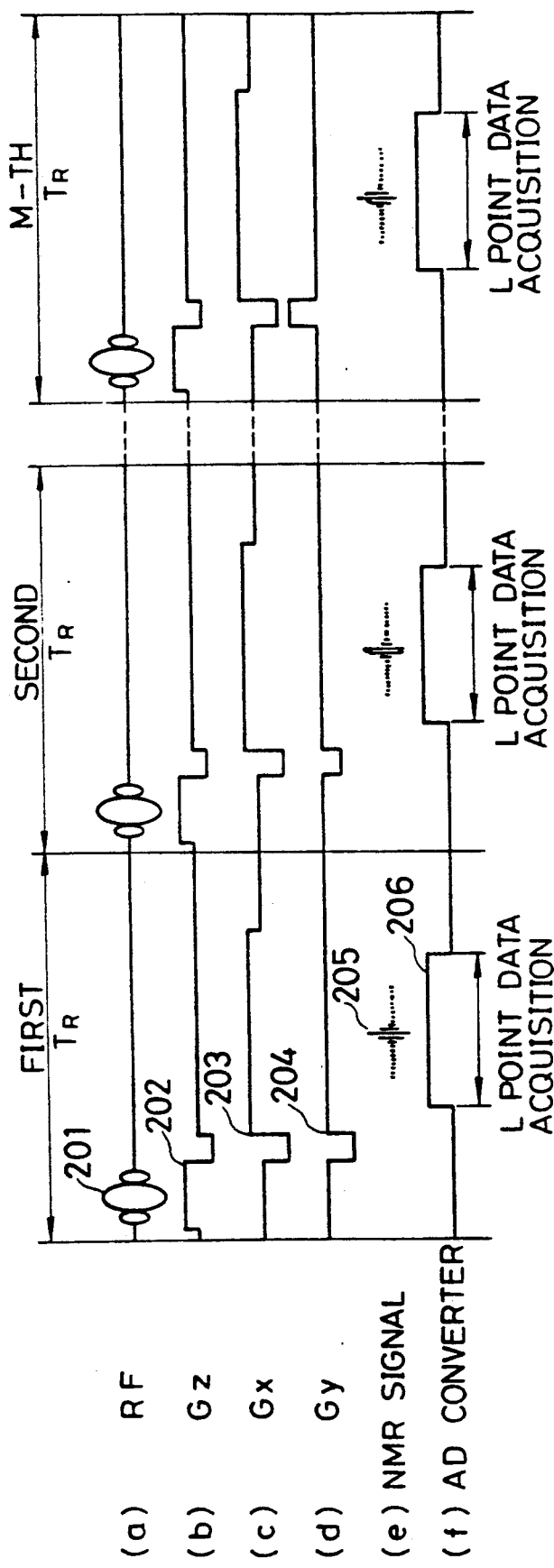
FIG. 2 is a time chart showing pulse sequences at various parts of the conventional apparatus when a two-dimensional Fourier transform is carried out by the conventional apparatus shown in FIG. 1.

When a two-dimensional Fourier transform is used to generate an L×M matrix image by using pulse sequences shown in FIG. 2, a subject undergoes a uniform magneto-static field as in FIG. 4, just as in FIG. 1. A command from the console 16 actuates the pulse sequencer 13, the respective gradient magnetic field power sources 5, 6, and 7, the RF transmitting system 8, the RF receiving system 9, and the A/D converter 10. Thus, the raw data in the form of digital signals are obtained, and are temporarily stored in the raw data buffer memory 22.

After L point data sampling and the A/D conversion thereof have been completed, the arithmetic unit A 21 is actuated, and a Fourier transform in the first dimension (i.e., calculation of the equation (2)) is executed. Results of this operation (intermediate data) are transferred to the intermediate data buffer memory 20 through the system bus 12. A series of these operations are repeated M times at the interval of repetition time $T_R$. After M repetitions, the arithmetic unit B 19 is actuated, and a post-operation such as a Fourier transform in the second dimension (i.e., calculation of the equation (3)) and calculation of absolute values, is executed. Thus, a two-dimensional image is generated, and this image is transmitted to the console 16 through the system bus 12 to be displayed.

Figure 5:
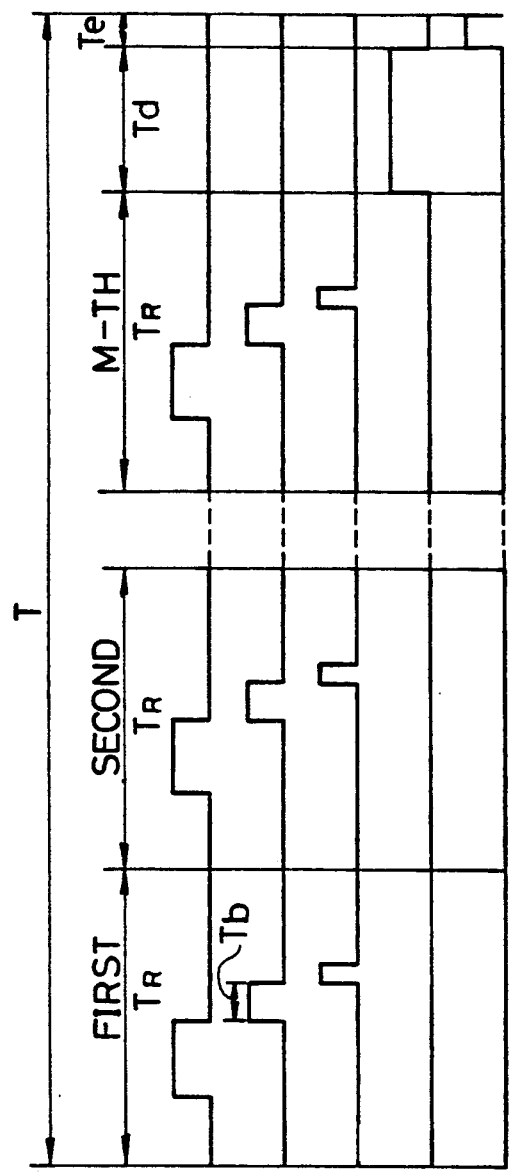
FIG. 5 is a time chart showing the operation of the apparatus when a two-dimensional Fourier transform is carried out by the apparatus shown in FIG. 4.

FIG. 5 is a timing chart of the above operations. In FIG. 5, pulse sequence (a) illustrates the operation of the A/D converter 10, pulse sequence (b) illustrates the Fourier transform in the first dimension by the arithmetic unit A 21 and $T_b$ is the time required to perform the Fourier transform in the first dimension, (c) illustrates transfers of the data which is the result of processing (b) to the intermediate data buffer memory 20, (d) illustrates the Fourier transform in the second dimension and the post-processing by the arithmetic unit B 19, and (e) illustrates the transfer and display processing of the generated image. As is clearly seen from the pulse sequences (a) and (b) in this figure, the Fourier transform in the first dimension is executed during the period of data acquisition, and the total examination time T is expressed as follows.

$$T = T_R \times M + T_d + T_e \qquad (8)$$
$$\{ = T_R \times M + (T_b \times M) + T_d + T_e \}$$

where $T_R$: repetition time, $T_b$: time required to perform the Fourier transform in the first dimension, M: the number of matrices in the direction of Gy, $T_d$: the processing time for a Fourier transform in the second dimension and post-processing time (time required for image reconstruction), $T_e$: image transfer/display time.

The expression in the brackets { } shows the conventional examination time.

Figure 3:
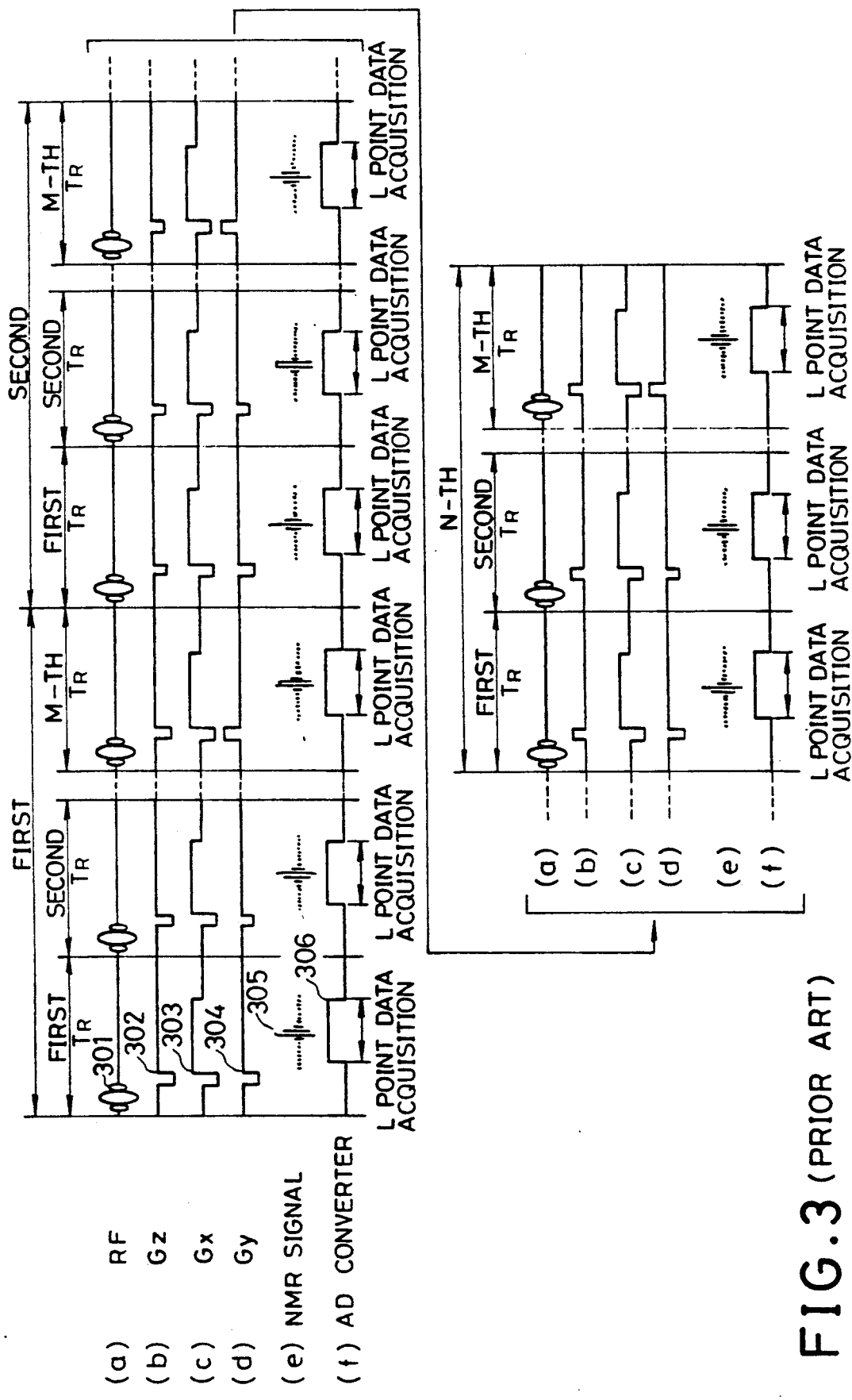
FIG. 3 is a time chart showing pulse sequences at various parts of the conventional apparatus when a three-dimensional Fourier transform is carried out by the conventional apparatus shown in FIG. 1.

Next, an example will be explained in which a three dimensional Fourier transform is used to generate an image of an L×M×N matrix by the pulse sequences in FIG. 3.

In this case, the A/D conversion operations are similar to those carried out by the conventional apparatus shown in FIG. 1. Namely, the raw data converted into digital signals through the A/D converter 10 are temporarily stored in the raw data buffer memory 22; after L point data sampling and A/D conversion are completed, the arithmetic unit A 21 is actuated, and the Fourier transform in the first dimension (equation (5) above) is executed; and the operation results (intermediate data) are transferred to the intermediate data buffer memory 20 through the system bus 12. After a series of these operations is repeated M times at the interval of repetition time $T_R$, the arithmetic unit B 19 is actuated, and the Fourier transform in the second dimension (equation (6) above) is performed. After this M time repetition has been repeated N times, and the acquisition of all the data and the Fourier transforms in the first and second dimensions have been completed, the arithmetic unit B 19 is actuated so that a Fourier transform in the third dimension (equation (7) above) and post-processing is performed, thus generating an image. The generated image is transferred to the console 16 through the system bus 12, and is displayed. Here, two arithmetic units A 21 and B 19 are used, but these units can be integrated to one unit.

Figure 6:
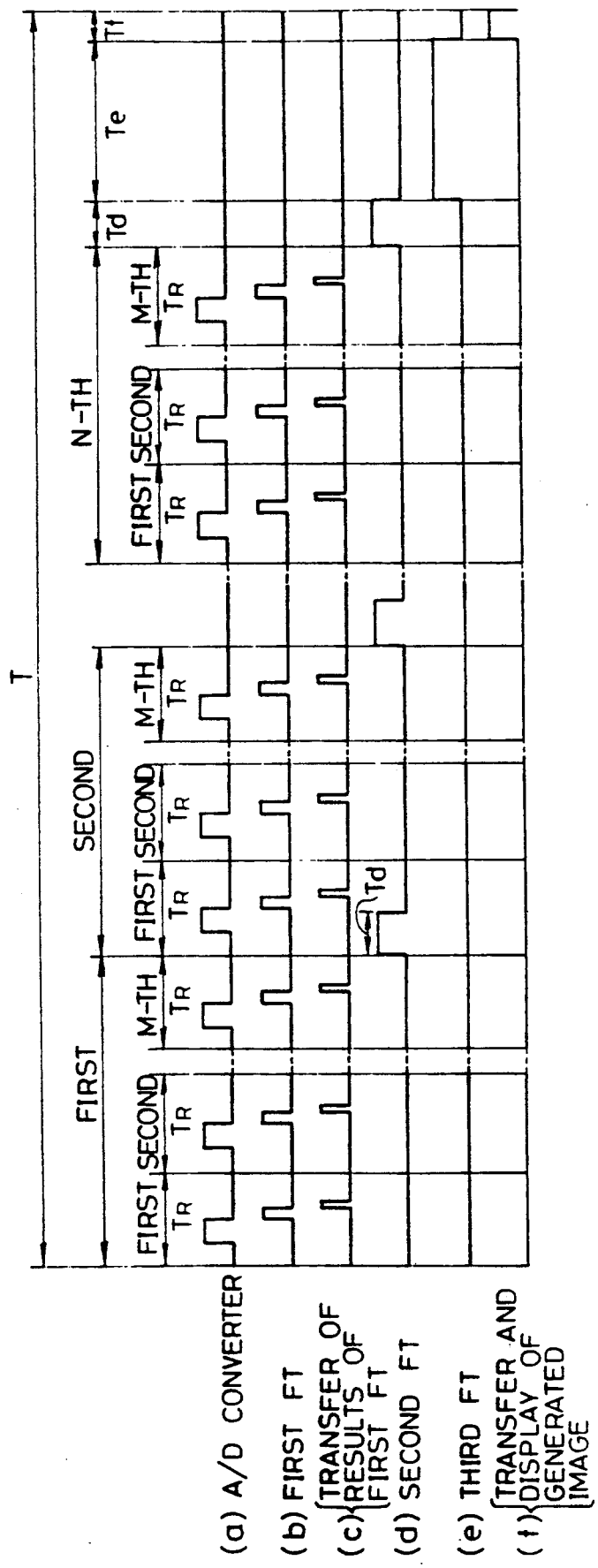
FIG. 6 is a time chart showing the operation of the apparatus when a three-dimensional Fourier transform is carried out by the apparatus shown in FIG. 4.

These operations are shown in FIG. 6. The pulse sequence (a) in this figure shows the operation of the A/D converter 10, the pulse sequence (b) illustrates the operation of the Fourier transform in the first dimension by the arithmetic unit A 21, sequence (c) indicates transfers of operated results of the processing (b) to the intermediate data buffer memory 20, (d) represents the Fourier transforms in the second dimension by the arithmetic unit B 19, (e) indicates the Fourier transform in the third dimension and post-processing by the arithmetic unit B 19, and (f) illustrates transfers of a generated image to the console 16 and the display processing. As clearly seen from this figure, all the Fourier transforms in the first dimension and all the Fourier transforms in the second dimension except the last are performed during the period of data acquisition. The total examination time T in this case is as follows;

$$T = T_R \times M \times N + Td + Te + Tf \qquad (9)$$
$$\{= (T_R + Tb) \times M \times N + Td \times N + Te + Tf\}$$

where
 $T_R$: repetition time,
 M: the number of matrices in the direction of Gy,
 N: the number of matrices in the direction of Gz,
 Td: processing time of the Fourier transform in the second dimension at the point M,
 Te: time required for the Fourier transform in the third dimension and post-processing,
 Tf: image transfer/display time.

The image reconstruction time becomes Td+Te. Here, the expression in the brackets { } shows the conventional examination time.

As described above, the present invention can reduce the time required for Fourier transform performed in the image reconstruction computation to approximately ½ in the nuclear magnetic resonance imaging apparatus using two- or three-dimensional Fourier transform. Thus, the present invention has an advantage that an image can be quickly displayed.

The invention has been described in detail with respect to preferred embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

What is claimed is:

1. A magnetic resonance imaging apparatus comprising:

magnetostatic field applying means for applying a magnetostatic field in a magnetostatic direction to a subject;

first gradient magnetic field imposing means for imposing a first gradient magnetic field on the subject, the first gradient magnetic field being oriented in the magnetostatic direction and changing in magnitude along a first direction perpendicular to the magnetostatic direction;

second gradient magnetic field imposing means for imposing a phase encoded gradient magnetic field on the subject, said phase encoded gradient magnetic field being generated with a different phase at a constant repetition interval and being oriented in the magnetostatic direction and changing in magnitude along a second direction perpendicular to the first direction and the magnetostatic direction;

data acquisition means for acquiring and outputting a series of portions of nuclear magnetic resonance data required to reconstruct a two-dimensional image of the subject, each portion of nuclear magnetic resonance data being output every repetition time; and image reconstruction computation means, coupled to said data acquisition means, for receiving the series of portions of the nuclear magnetic resonance data and forming the two-dimensional image based on the series of portions of nuclear magnetic resonance data including:

first computing means for executing a Fourier transform on each one of the portions of the nuclear magnetic resonance data in a first dimension every repetition time immediately after said data acquisitions means outputs said one of the portions of nuclear magnetic resonance data, and second computing means for executing a Fourier transform in a second dimension corresponding to the second direction after said data acquisition means has acquired the series of portions of nuclear magnetic resonance data required to reconstruct the two-dimensional image of the subject.

2. A magnetic resonance imaging apparatus as claimed in claim 1, wherein said first and second computing means are integrated into one computing means.

3. A magnetic resonance imaging apparatus comprising:

magnetostatic field applying means for applying a magnetostatic field in a magnetostatic direction to a subject;

first gradient magnetic field imposing means for imposing a first gradient magnetic field on the subject, the first gradient magnetic field being oriented in the magnetostatic direction and changing in magnitude along a first direction perpendicular to the magnetostatic direction;

second gradient magnetic field imposing means for imposing a first phase encoded gradient magnetic field on the subject, the first phase encoded gradient magnetic field being generated with a first different phase at a first constant repetition interval and being oriented in the magnetostatic direction and changing in magnitude along a second direction perpendicular to both the magnetostatic direction and the first direction;

third gradient magnetic field imposing means for imposing a second phase encoded gradient magnetic field on the subject, said second phase encoded gradient magnetic field being generated with a second different phase at a second constant repetition interval and being oriented in the magnetostatic direction and changing in magnitude along the magnetostatic direction;

data acquisition means for acquiring and outputting a series of portions of nuclear magnetic resonance data required to reconstruct the three-dimensional image of the subject, each portion of nuclear magnetic resonance data being output every repetition interval; and image reconstruction computation means coupled to said data acquisition means for receiving the series of portions of nuclear magnetic resonance data and for forming the three-dimensional image on the basis of the series of portions of nuclear magnetic resonance data including:

first computing means for executing a Fourier transform on each portion of the nuclear magnetic resonance data in a first dimension corresponding to the first direction, immediately after said data acquisition means outputs each portion of nuclear magnetic resonance data, second computing means for executing a Fourier transform in a second dimension corresponding to the second direction immediately after predetermined times of data acquisition in the second direction is completed, and third computing means for executing a Fourier transform in a third dimension corresponding to the magnetostatic direction after the Fourier transforms in the first and second dimensions have been completed and said data acquisition means has acquired the series of portions of the nuclear magnetic resonance data required to reconstruct the three-dimensional image of the subject.

4. A magnetic resonance imaging apparatus as claimed in claim 3, wherein said third computing means is integrated into one unit with at least one of said first and second computing means.

* * * * *

UNITED STATES PATENT AND TRADEMARK OFFICE
CERTIFICATE OF CORRECTION

PATENT NO.   : 5,089,777
DATED        : February 18, 1992
INVENTOR(S)  : Mitsutoshi IINO et al.

It is certified that error appears in the above-identified patent and that said Letters Patent is hereby corrected as shown below:

Title page, Item [75], change "Shirou Nakato" to --Shirou Nakatao--.

Signed and Sealed this

Fourteenth Day of September, 1993

Attest:

BRUCE LEHMAN

*Attesting Officer*         *Commissioner of Patents and Trademarks*